United States Patent [19]

Merrill et al.

[11] 4,130,894
[45] Dec. 19, 1978

[54] LOOP ORGANIZED SERIAL-PARALLEL-SERIAL MEMORY STORAGE SYSTEM

[75] Inventors: Richard B. Merrill, Millwood; Yen S. Yee, White Plains, both of N.Y.

[73] Assignee: International Business Machines Corporation, Armonk, N.Y.

[21] Appl. No.: 853,729

[22] Filed: Nov. 21, 1977

[51] Int. Cl.² ............................................. G11C 27/00
[52] U.S. Cl. ...................................... 365/183; 365/51; 307/238
[58] Field of Search .................... 365/51, 183; 307/238

[56] References Cited

U.S. PATENT DOCUMENTS

| | | | |
|---|---|---|---|
| 3,771,149 | 11/1973 | Collins et al. | 365/51 |
| 3,942,163 | 3/1976 | Goyal | 365/183 |
| 3,953,837 | 4/1976 | Cheek, Jr. | 365/238 |
| 3,958,210 | 5/1976 | Levine | 365/183 |
| 3,967,254 | 6/1976 | Kosonocky et al. | 365/219 |

*Primary Examiner*—Terrell W. Fears
*Attorney, Agent, or Firm*—John J. Goodwin

[57] ABSTRACT

A functional and structural arrangement for charge-coupled device binary or multi-level storage systems of a modified serial-parallel serial type memory block arrangement wherein the output sequence is removed from the memory block proximate to the location where the original sequence was entered into the memory block. The structure includes two memory block portions designated as the left and right memory block portions. The input information sequence is entered into the upper left side of the right memory block portion in serial fashion, is moved in parallel to the bottom of the right memory block portion and serially removed from the lower left side of the right memory block portion and entered into the lower right side of the left memory block portion. The sequence is moved in parallel to the top of the left memory block portion and serially removed from the upper right side of the left memory block portion proximate to the original input location for comparison to the reference charge sequence in an analog-to-digital regeneration operation utilizing the same digital-to-analog converter.

7 Claims, 1 Drawing Figure

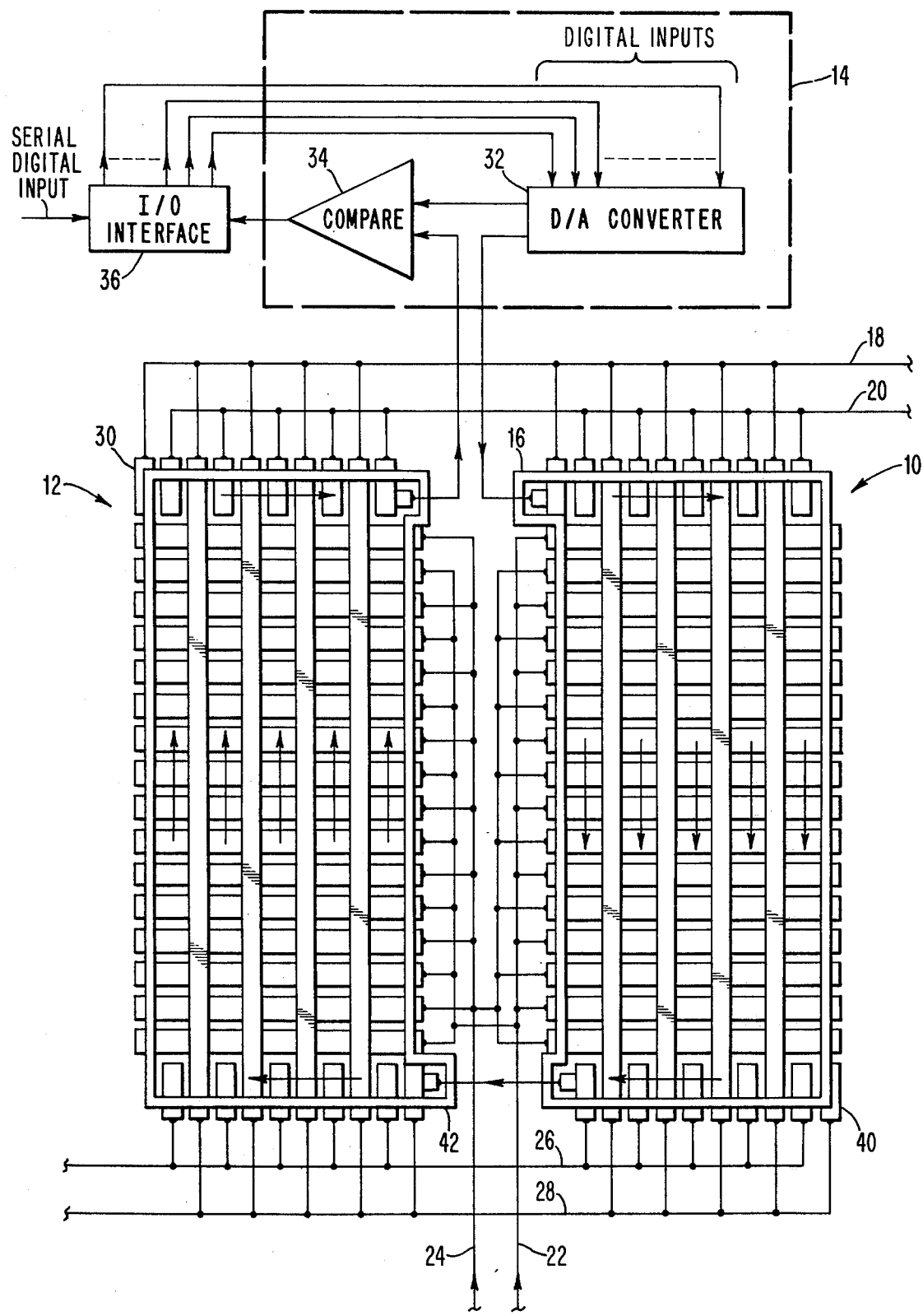

LOOP ORGANIZED SERIAL-PARALLEL-SERIAL MEMORY STORAGE SYSTEM

BACKGROUND OF THE INVENTION

1. Field of the Invention

The present invention relates to charge-transfer-device binary or multi-level memory storage structures, and more particularly to an improved memory structure of the type known as serial-parallel-serial (SPS).

2. Description of the Prior Art

Storage structures employing charge-transfer-device technology are well known, as well as the specific example of the serial-parallel-serial (SPS) binary storage memory block. In the text CHARGE TRANSFER DEVICES by Carlo H. Séquin and Michael F. Tompsett, copyright 1975 by Academic Press, Inc. at pages 243–247, a description is given for a coventional binary serial-parallel-serial (SPS) memory block embodied in charge-coupled-device technology. The system described therein consists of a memory block having an input means at the upper left side of the block and an output means at the lower right side of the block. This arrangement is in logical accordance with the usual sequencing and transfer of the stored charge packets, that is, "first in-first out", but suffers the disadvantage that in order to minimize error the output information must be transferred by some independent means back to the input for the comparison necessary for analog to digital conversion using the same digital-to-analog converter.

SUMMARY OF THE INVENTION

A loop organized serial-parallel-serial memory block structure being interconnected wherein the output means of the memory is proximate to the memory input means so that the output sequence of analog charge packets can be compared to the reference sequence of analog charge packets at the input without transporting the input sequence to the output by separate registers or over long transmission lines using charge transport circuits of the precision type to avoid introducing additional errors. The memory block structure is also interconnected such that the output sequence is in the same relative order as the input (that is, first in-first out) for direct comparison and conversion to a digital representation for the process of refresh and regeneration proximate to the input location using the same digital-to-analog converter.

Thus, an object of the present invention is to provide an improved loop organized serial-parallel-serial memory block arrangement in charge coupled device binary or multi-level analog storage.

Another object of the present invention is to provide a loop organized serial-parallel-serial memory block arrangement wherein the output sequence is removed from the memory block proximate to the location where the original input sequence was entered into the memory block.

A still further object of the present invention is to provide a memory organization wherein the same digital-to-analog converter used to provide the input charge packets is utilized in the analog-to-digital operation to minimize tracking errors or reference charge sequence degradation error.

The foregoing and other objects, features and advantages of the invention will be apparent from the following more particular description of a preferred embodiment of the invention, as illustrated in the accompanying drawings.

BRIEF DESCRIPTION OF THE DRAWINGS

The single FIGURE is a schematic block diagram illustrating one embodiment of a loop organized serial-parallel-serial multi-level storage system according to the principles of the present invention.

DESCRIPTION OF THE PREFERRED EMBODIMENT

Referring to the drawing, a multi-level memory block structure is shown including a first block portion 10 and a second block portion 12. Multi-level storage refers to storing more than one bit or more than two levels of information in a memory element as in contrast to binary storage which stores one bit or two levels of information. The memory blocks portions 10 and 12 may be embodied in charge-coupled-device technology wherein discrete charge packets are stored and shifted via registers in accordance with known techniques as discussed in the aforesaid Séquin and Tompsett text. Initially, a serial digital input is introduced through an interface 36 and applied to a digital-to-analog converter 32 within analog-to-digital converter means 14. The digital-to-analog converter 32 is provided to convert input digital signals into corresponding analog charge packets. Such digital-to-analog charge packet converters are known in the art. In addition to producing a signal charge packet (referred to as $Q_s$) in the digital-to-analog operation, digital-to-analog converter 32 also, in a conventional manner, continually generates a reference sequence (QRef/2), (QRef/4), (QRef/8) ... which corresponds to the most significant bit output, the next significant bit output, etc. of the digital-to-analog converter. This reference sequence is entered into a comparator 34 to be employed later in the analog-to-digital conversion of the memory output signals. This time sharing arrangement of using the same digital-to-analog converter for both information packet generation for the memory and for generating a reference charge sequence for subsequent analog-to-digital conversion permits the elimination of tracking error. Information (i.e. the analog charge packets) is read into block portion 10 from digital-to-analog converter 14 in serial sequence by means of a serial shift register 16 under control of shift pulses occurring on lines 18 and 20. Each line of information is then stepped down the array in parallel under control of shift pulses P1 and P2 occurring on lines 22 and 24.

When the information has been shifted to the bottom row in prior art memory block arrangements, the information is shifted out to the right so that the information charge packets are in the same sequence as when entered, that is, first in-first out. However, in a multi-level storage memory, it is desirable that this output sequence be compared with the aforesaid reference sequence in order to reconvert the analog output the aforesaid reference sequence in order to reconvert the analog output into a corresponding digital word. Alternatively, a separate sequence generator can be provided at the output. In order to minimize any mismatch error in generating the charge sequences, the reference charge sequence used in the analog-to-digital conversion is also generated by the same digital-to-analog converter 14 which produces the multi-level input sequence. Therefore, in the prior art, either the reference charge sequence from the digital-to-analog converter must be transferred to the lower right side output point of the memory, or the analog output sequence must be transferred back to digital-to-analog converter at the upper left side input location. This involves additional registers or other charge transport circuits of the precision type over long lines which introduce delays and errors.

In the present invention, as illustrated in the drawing, the sequence in the bottom row of block portion 10 is contained within a single shift register 42 and is sequenced from the bottom of block portion 10 to the bottom of block portion 12 by shift pulses on lines 26 and 28 (i.e. from right to left). In the drawing, a single shift register 42 is illustrated in two separate portions for purposes of clarity, however, if it is desired to use two separate shift registers under the control of shift pulses on the same lines 26 and 28, this is also possible.

The sequence in the portion of shift register 42 in the bottom row of block portion 12 is moved in parallel up through the block portion under the control of shift pulses on lines 22 and 24. Finally, the sequence is shifted out of block portion 12 by serial shift register 30 under the control of shift pulses on lines 18 and 20. The sequence is shifted out from left to right in the drawing so that the output sequence is in the proper order (first in-first out) and it is entered into comparator 34 at a location proximate to digital-to-analog converter 32 so that the analog output from the memory can be compared with the reference sequence from the same digital-to-analog converter 32 for analog-to-digital conversion and regeneration operations.

Thus, in contrast to conventional prior art serial-parallel-serial memory organizations, the loop organized serial-parallel-serial structure of the present invention is arranged such that the information charge packets are available in proper sequence at a location proximate to the digital-to-analog converter 32. This arrangement eliminates the need for transporting the information packets back to the memory input by separate shift registers or by transporting the reference charge sequence to the memory output area, as is necessary in the prior art, by separate shift registers or over long transmission lines using precision charge transport circuits, and, therefore, the introduction of additional errors is avoided in the present invention.

To perform the analog-to-digital conversion and regeneration operation at the memory input, the information charge packet $Q_s$ is compared with the reference sequence (QRef/2), (QRef/4), (QRef/8), etc. in a binary search manner. More specifically, $Q_s$ from output register 30 is first compared with (QRef/2) from digital-to-analog converter 32 in comparator 34. The result of this comparison determines the most significant bit. Dependent on the first comparison result (either + or −), (QRef/2 + QRef/4) will be compared with $Q_s$ or QRef/2 will be compared with ($Q_s$ + QRef/4) to determine the next most significant bit. This binary search comparison operation continues until this analog-to-digital operation is completed. The regeneration process is completed when the digital word thus produced which represent charge packet $Q_s$ is inputed to digital-to-analog converter 32 through interface 36 to generate a new $Q_s$ to be placed back into the loop organized serial-parallel-serial memory block.

It should be appreciated that the operation of the structure illustrated in the drawing is not limited to the particular arrangement described. For example, the structure may be modified easily such that the input may be made from right to left into register 30 at the top left of memory block 12, be shifted to the left and then down, shifted from left to right into the bottom of memory block 10, shifted up to register 16 and then shifted out right to left from register 16 at the top left of memory block 10. Likewise, the loop sequence may be counter-clockwise from left to right into the bottom or memory block 10, then up, then from right to left into the top of memory block 12, then down and then shifted out the bottom of memory block 12 from left to right. Another alternative would be a clockwise loop operation from right to left into block 12, then up and out the top of block 10 from left to right and into the top of block 10, then down and finally out the bottom of block 10 from right to left. In any of the above embodiments, the output location is proximate to the input location (at which located the conversion means 14 and interface 36 will be located) and the sequence of operation is circular.

Also, although the embodiment shown in the drawing was described as a charge-coupled-device structure, other types of electronic storage technologies may be equally employed including bucket-brigade as well as typical binary memories. Furthermore, for purposes of description and understanding, the structure was illustrated as two separated and distinct arrays. The separation is required to be only functional however, and in practice the invention may be embodied in a single, integral structure.

The present invention is also not limited to the particular type of memory block illustrated in the drawing. For example, an electrode-per-bit structure illustrated in FIG. 7.5(a) on page 248 of the Séquin and Tompsett text and the multiphase electrode-per-bit structure illustrated in FIG. 7.5(b) thereof may also be employed in the present invention. In fact, the present invention, which is directed to transferring memory contents in a loop or circular fashion while still maintaining proper information sequence, may be applied to any memory structure application wherein the output of the memory and the input of the memory are desired to be at the same proximate location.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A loop organized serial-parallel-serial memory structure comprising:
a first signal storage array including signal storage elements arranged in rows and columns wherein said rows are functionally arranged from a top row to a bottom row and said columns are functionally arranged from a left column to a right column,
a second signal storage array including signal storage elements arranged in rows and columns wherein said rows are functionally arranged from a top row to a bottom row and said columns are functionally arranged from a left column to a right column, said second signal storage array being functionally disposed to the left of said first signal storage array such that said left column of said first signal storage array is proximately opposed to said right column of said second signal storage array and are mutually separated by a central region intermediate said first and second signal storage arrays, a signal input means located in said central region in between said first and second signal storage arrays and connected to a selected row of one of said first and second signal storage arrays for entering an input signal into said selected row of one of said first and second signal storage arrays, a signal output means located in said central region and connected to a selected row of the other of said first and second signal storage arrays in juxtaposition to said signal input means for removing an output signal from said selected row of the other of said first and second signal storage arrays, and transfer signal means connected to said first and second signal storage arrays for transferring said input signal entered into said one of said first and second storage arrays through said one of said first and second storage arrays; out of said one of said first and second arrays; and into said other of said first and second arrays; through said other of said first and second storage arrays; and out of said output means as an output signal.

2. A loop organized serial-parallel-serial memory structure according to claim 1 wherein said signal input means is connected to the left side of said top row of said first signal storage array for entering said input signal into said top row wherein said signal output means is connected to the right side of the top row of said second signal storage array, and wherein said signal transfer means connected to said first and second signal storage arrays operates to transfer said input signal down through said columns of said first signal storage array and into said bottom row of said first signal storage array; out of the left side of said bottom row of said first signal storage array and into the right side of said bottom row of said second signal storage array; up through said columns of said second signal storage array to said top row of said second signal storage array; and out of the right side of said top row of said second signal storage array and to said signal output means to form a clockwise signal transfer loop wherein said input means and said output means are at the same proximate location between the top rows of said first and second signal storage arrays.

3. A loop organized serial-parallel-serial memory structure according to claim 1 wherein said signal input means is connected to the right side of said top row of said second signal storage array for entering said input signal into said top row wherein said signal output means is connected to the left side of the top row of said first signal storage array, and wherein said signal transfer means connected to said first and second signal storage arrays operates to transfer said input signal down through said columns of said second signal storage array and into said bottom row of said second signal storage array; out of the right side of said bottom row of said second signal storage array and into the left side of said bottom row of said first signal storage array; up through said columns of said first signal storage array to said top row of said first signal storage array; and out of the left side of said top row of said first signal storage array and to said signal output means to form a counter-clockwise signal transfer loop wherein said input means and said output means are at the same proximate location between the top rows of said first and second signal storage arrays.

4. A loop organized serial-parallel-serial memory structure according to claim 1 wherein said signal input means is connected to the left side of said bottom row of said first signal storage array for entering said input signal into said bottom row wherein said signal output means is connected to the right side of the bottom row of said second signal storage array, and wherein said signal transfer means connected to said first and second signal storage arrays operates to transfer said input signal up through said columns of said first signal storage array and into said top row of said first signal storage array; out of the left side of said top row of said first signal storage array and into the right side of said top row of said second signal storage array; down through said columns of said second signal storage array to said bottom row of said second signal storage array; and out of the right side of said bottom row of said second signal storage array and to said signal output means to form a counter-clockwise signal transfer loop wherein said input means and said output means are at the same proximate location between the bottom rows of said first and second signal storage arrays.

5. A loop organized serial-parallel-serial memory structure according to claim 1 wherein said signal input means is connected to the right side of said bottom row of said second signal storage array for entering said input signal into said bottom row wherein said signal output means is connected to the left side of the bottom row of said firt signal storage array, and wherein said signal transfer means connected to said first and second signal storage arrays operates to transfer said input signal up through said columns of said second signal storage array and into said top row of said second signal storage array; out of the right side of said top row of said second signal storage array and into the left side of said top row of said first signal storage array; down through said columns of said first signal storage array to said bottom row of said first signal storage array; and out of the left side of said bottom row of said first signal storage array and to said signal output means to form a clockwise signal transfer loop wherein said input means and said output means are at the same proximate location between the bottom rows of said first and second signal storage arrays.

6. A loop organized serial-parallel-serial memory structure according to claim 1 further including a digital-to-analog converter circuit having an input connected to a source of digital information signals and an output connected to said signal input mean connected to said one of said first and second signal storage arrays, said digital-to-analog converter circuit being responsive to said digital information signals for producing a reference signal sequence and producing analog signals representative of said digital information signals, said analog signals being said input signal entered into said one of said first and second signal storage arrays, and a signal comparision means connected to the output of said digital-to-analog converter circuit and to said signal output means connected to the other of said first and second signal storage arrays, said signal comparison means being responsive to said reference signal sequence from said digital-to-analog converter and to said output signal from said other of said first and second signal storage arrays for converting said output signal from said other signal storage array into a digital signal.

7. A loop organized serial-parallel-serial memory structure according to claim 6 wherein said digital-to-analog converter is a charge-coupled-device circuit for producing analog signals and said reference signal sequence manifested as discrete packets of electrical charge wherein said charge packets have different quantities of electrical charge to represent the value of said analog signal, and wherein said first and second signal storage arrays are charge-coupled-device technology storage arrays including charge storage elements for storing and transferring said discrete packets of charge.

* * * * *